(12) United States Patent
Vega et al.

(10) Patent No.: US 9,035,430 B2
(45) Date of Patent: May 19, 2015

(54) SEMICONDUCTOR FIN ON LOCAL OXIDE

(75) Inventors: Reinaldo A. Vega, Wappingers Falls, NY (US); Michael V. Aquilino, Wappingers Falls, NY (US); Daniel J. Jaeger, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/597,799

(22) Filed: Aug. 29, 2012

(65) Prior Publication Data

US 2014/0061862 A1    Mar. 6, 2014

(51) Int. Cl.

| | | |
|---|---|---|
| H01L 21/02 | (2006.01) | |
| H01L 21/308 | (2006.01) | |
| H01L 21/32 | (2006.01) | |
| H01L 21/762 | (2006.01) | |
| H01L 29/66 | (2006.01) | |
| H01L 29/78 | (2006.01) | |

(52) U.S. Cl.
CPC ...... *H01L 21/76281* (2013.01); *H01L 21/3081* (2013.01); *H01L 21/3086* (2013.01); *H01L 21/32* (2013.01); *H01L 21/76208* (2013.01); *H01L 29/66795* (2013.01); *H01L 29/785* (2013.01)

(58) Field of Classification Search
USPC .......... 257/192, 616, 327, E29.225, E21.409
See application file for complete search history.

(56) References Cited

U.S. PATENT DOCUMENTS

| | | |
|---|---|---|
| 5,789,290 A | 8/1998 | Sun |
| 7,326,611 B2 | 2/2008 | Forbes |
| 7,495,285 B2 | 2/2009 | Lee |
| 7,560,358 B1 | 7/2009 | Kim et al. |
| 7,973,389 B2 | 7/2011 | Rios et al. |
| 2009/0008705 A1 * | 1/2009 | Zhu et al. ...................... 257/327 |
| 2009/0256207 A1 | 10/2009 | Chen et al. |
| 2009/0278196 A1 * | 11/2009 | Chang et al. .................. 257/328 |
| 2010/0144121 A1 | 6/2010 | Chang et al. |
| 2010/0320530 A1 | 12/2010 | Cheng |
| 2011/0073952 A1 * | 3/2011 | Kwok et al. .................. 257/368 |
| 2012/0052640 A1 | 3/2012 | Fischer et al. |

OTHER PUBLICATIONS

International Search Report/Written Report, US2013/046211; Nov. 19, 2013.

* cited by examiner

*Primary Examiner* — Dale E Page

(74) *Attorney, Agent, or Firm* — Scully, Scott, Murphy & Presser, P.C.; H. Daniel Schnurmann

(57) ABSTRACT

A semiconductor substrate including a first epitaxial semiconductor layer is provided. The first epitaxial semiconductor layer includes a first semiconductor material, and can be formed on an underlying epitaxial substrate layer, or can be the entirety of the semiconductor substrate. A second epitaxial semiconductor layer including a second semiconductor material is epitaxially formed upon the first epitaxial semiconductor layer. Semiconductor fins including portions of the second single crystalline semiconductor material are formed by patterning the second epitaxial semiconductor layer employing the first epitaxial semiconductor layer as an etch stop layer. At least an upper portion of the first epitaxial semiconductor layer is oxidized to provide a localized oxide layer that electrically isolates the semiconductor fins. The first semiconductor material can be selected from materials more easily oxidized relative to the second semiconductor material to provide a uniform height for the semiconductor fins after formation of the localized oxide layer.

19 Claims, 15 Drawing Sheets

SEMICONDUCTOR FIN ON LOCAL OXIDE

BACKGROUND

The present disclosure relates to a semiconductor structure, and more particularly to a semiconductor structure including a semiconductor fin on a localized oxide, and a method of manufacturing the same.

While bulk semiconductor substrates are less costly than SOI substrates, bulk semiconductor substrates pose difficulties in device isolation because planar field effect transistors are junction isolated. As devices are scaled down, junction doping must increase to maintain the same level of junction isolation, but this tends to increase junction leakage.

Fin field effect transistors (finFETs) provide enhanced short channel performance over planar field effect transistors. However, typical finFETs require a semiconductor-on-insulator (SOI) substrate in order to provide electrically isolated semiconductor fins. Use of an SOI substrate significantly increases the cost of manufacturing, and therefore, a method of forming finFETs without employing an SOI substrate is desired.

SUMMARY

A semiconductor substrate including a first epitaxial semiconductor layer is provided. The first epitaxial semiconductor layer includes a first semiconductor material, and can be formed on an underlying epitaxial substrate layer, or can be the entirety of the semiconductor substrate. A second epitaxial semiconductor layer including a second semiconductor material is epitaxially formed upon the first epitaxial semiconductor layer. Semiconductor fins including portions of the second single crystalline semiconductor material are formed by patterning the second epitaxial semiconductor layer employing the first epitaxial semiconductor layer as an etch stop layer. At least an upper portion of the first epitaxial semiconductor layer is oxidized to provide a localized oxide layer that electrically isolates the semiconductor fins. The first semiconductor material can be selected from materials that are more easily oxidized relative to the second semiconductor material to provide a uniform height for the semiconductor fins after formation of the localized oxide layer.

According to an aspect of the present disclosure, a semiconductor structure includes a single crystalline semiconductor material portion in a substrate, and a semiconductor oxide portion located on the single crystalline semiconductor material portion. The semiconductor oxide portion comprises a first semiconductor oxide portion including an oxide of a first semiconductor material and a second semiconductor oxide portion contacting a top surface of the first semiconductor oxide portion and including an oxide of a second semiconductor material that is different from the first semiconductor material. The semiconductor structure further includes a semiconductor fin that includes a portion of the second semiconductor material.

According to another aspect of the present disclosure, a method of forming a semiconductor structure is provided. A semiconductor substrate including a first epitaxial semiconductor layer that includes a first single crystalline semiconductor material is provided. A second epitaxial semiconductor layer including a second single crystalline semiconductor material in epitaxial alignment with, and having a different composition from, the first single crystalline semiconductor material on the first epitaxial semiconductor layer is formed. A patterned etch mask layer is formed over the second epitaxial semiconductor layer. An anisotropic etch is performed through the second epitaxial semiconductor layer employing the patterned etch mask layer as an etch mask and employing the first epitaxial semiconductor layer as an etch stop layer. A semiconductor fin including a remaining portion of the second epitaxial semiconductor material layer is formed by the anisotropic etch. An oxygen-impermeable spacer is formed on sidewalls of the semiconductor fin. A semiconductor oxide portion is formed by oxidizing at least portions of the first epitaxial semiconductor layer. A remaining portion of the semiconductor fin is vertically spaced from an unoxidized semiconductor material portion of the semiconductor substrate by the semiconductor oxide portion.

DETAILED DESCRIPTION

Figure 1:
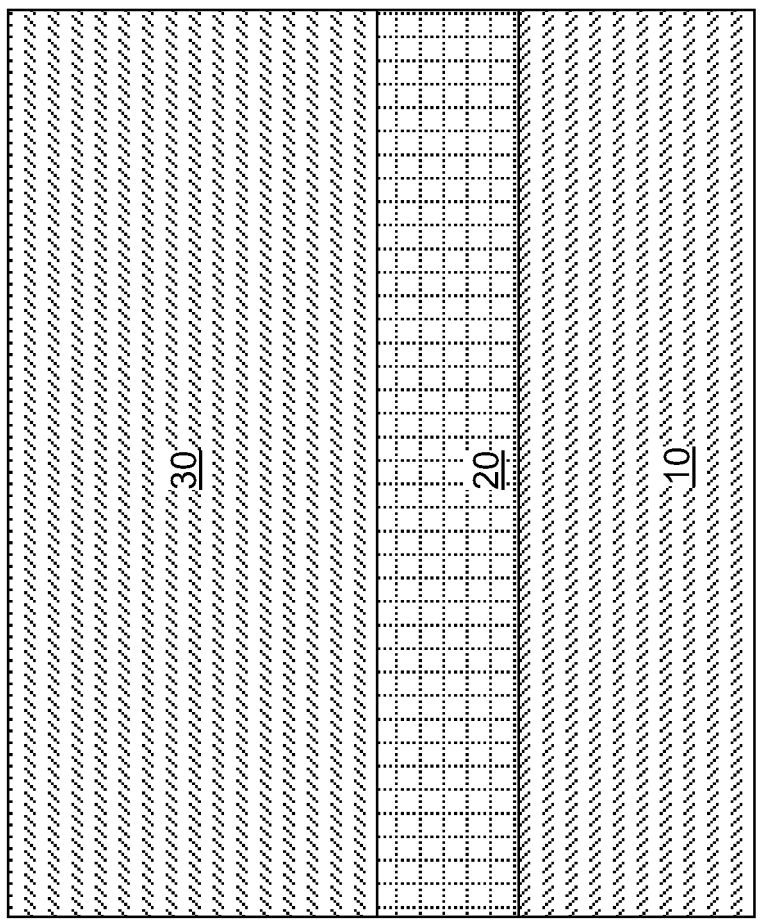
FIG. 1 is a vertical cross-sectional view of a first exemplary semiconductor structure after formation of a first epitaxial semiconductor layer and a second epitaxial semiconductor layer according to an embodiment of the present disclosure.

As stated above, the present disclosure relates to a semiconductor structure including a semiconductor fin on a localized oxide, and a method of manufacturing the same. Aspects of the present disclosure are now described in detail with accompanying figures. It is noted that like reference numerals refer to like elements across different embodiments. The drawings are not necessarily drawn to scale.

As used herein, ordinals such as "first," "second," and "third" are employed for the purpose distinguishing similar elements, and different ordinals may be employed for a same element across the specification and the claims.

Referring to FIG. 1, a first exemplary semiconductor structure includes a single crystalline semiconductor substrate 10 that includes a single crystalline semiconductor material. The single crystalline semiconductor substrate 10 can include silicon, germanium, a silicon-germanium alloy, a III-V compound semiconductor material, a II-VI compound semiconductor material, or any other semiconductor material that can be provided as a single crystalline semiconductor material.

A first epitaxial semiconductor layer 20 including a first single crystalline semiconductor material is formed on the top surface of the single crystalline semiconductor substrate 10. The first epitaxial semiconductor layer 20 is formed in epitaxial alignment with the single crystalline semiconductor material of the single crystalline semiconductor substrate 10. As used herein, "epitaxial alignment" refers to alignment of atoms in a same single crystalline structure. The first epitaxial semiconductor layer 20 can be formed by deposition of the first single crystalline semiconductor material by epitaxy. Alternately or additionally, the first epitaxial semiconductor layer 20 can be formed by implantation of an additional semiconductor material into an upper portion of the single crystalline semiconductor substrate 10 so that the implanted portion of the single crystalline semiconductor substrate 10 is converted into the first epitaxial semiconductor layer 20. The thickness of the first epitaxial semiconductor layer 20 can be from 20 nm to 200 nm, although lesser and greater thicknesses can also be employed.

In one embodiment, the first epitaxial semiconductor layer 20 can include the same semiconductor material as the single crystalline semiconductor substrate 10. In another embodiment, the first epitaxial semiconductor layer 20 can include a semiconductor material that is different from the semiconductor material of the single crystalline semiconductor substrate 10.

As used herein, a first semiconductor material and a second semiconductor material are "different" from each other if the composition of the first semiconductor material excluding electrical dopants is different from the composition of the second semiconductor material excluding electrical dopants. As used herein, "electrical dopants" refer to any atoms that generate extra holes or extra electrons above a level provided by an intrinsic semiconductor material. Thus, atoms that introduce any additional conductivity above the conductivity provided by an intrinsic semiconductor material are electrical dopants. For example, if a semiconductor material is an elemental semiconductor material or an alloy of at least two elemental semiconductor materials, all Group II elements, Group III elements, Group V elements, and Group VI elements are electrical dopants. If a semiconductor material is a compound semiconductor material, any atom that generates extra electrons or holes are electrical dopants.

For example, a first silicon-germanium alloy having an atomic concentration of silicon at a first percentage is considered to be a different semiconductor material from a second silicon-germanium alloy having an atomic concentration of silicon at a second percentage if the first percentage and the second percentage are different. However, two silicon-germanium alloys having the same atomic concentration of silicon relative to germanium but having different electrical dopants are considered to be the same semiconductor material because all electrical dopants are excluded from consideration in determining whether two semiconductor material are the same or different.

A second epitaxial semiconductor layer 30 including a second single crystalline semiconductor material is formed on the top surface of the first epitaxial semiconductor layer 20. The second epitaxial semiconductor layer 30 is formed in epitaxial alignment with the single crystalline semiconductor material of the first epitaxial semiconductor layer 20. The second epitaxial semiconductor layer 30 can be formed by deposition of the second single crystalline semiconductor material by epitaxy. Alternately or additionally, the second epitaxial semiconductor layer 30 can be formed by implantation of an additional semiconductor material into an upper portion of the first epitaxial semiconductor layer 20 so that the implanted portion of the first epitaxial semiconductor layer 20 is converted into the second epitaxial semiconductor layer 30. The thickness of the second epitaxial semiconductor layer 30 can be from 20 nm to 500 nm, although lesser and greater thicknesses can also be employed.

In one embodiment, the second epitaxial semiconductor layer 30 can include the same semiconductor material as the first epitaxial semiconductor layer 20. In another embodiment, the second epitaxial semiconductor layer 30 can include a semiconductor material that is different from the semiconductor material of the first epitaxial semiconductor layer 20.

In one embodiment, the second single crystalline semiconductor material in the second epitaxial semiconductor layer 30 is in epitaxial alignment with, and has a different composition from, the first single crystalline semiconductor material of the first epitaxial semiconductor layer 20. In one embodiment, the first single crystalline semiconductor material and the second single crystalline semiconductor material can be selected so that the first single crystalline semiconductor material has a greater oxidation rate than the second single crystalline semiconductor material.

For example, the first single crystalline semiconductor material can include a silicon germanium alloy, and the second single crystalline semiconductor material can include silicon. In another example, the first single crystalline semiconductor material can include germanium or a silicon germanium alloy, and the second single crystalline semiconductor material can include another silicon germanium alloy having a greater atomic concentration of silicon than the first single crystalline semiconductor material.

The single crystalline semiconductor material of the single crystalline semiconductor substrate 10 can be the same as, or can be different from, the second single crystalline semiconductor material in the second epitaxial semiconductor layer. The single crystalline semiconductor material of the single crystalline semiconductor substrate 10 is herein referred to as a third single crystalline semiconductor material. In one embodiment, the third single crystalline semiconductor material can be different from the first single crystalline semiconductor material.

Figure 2:
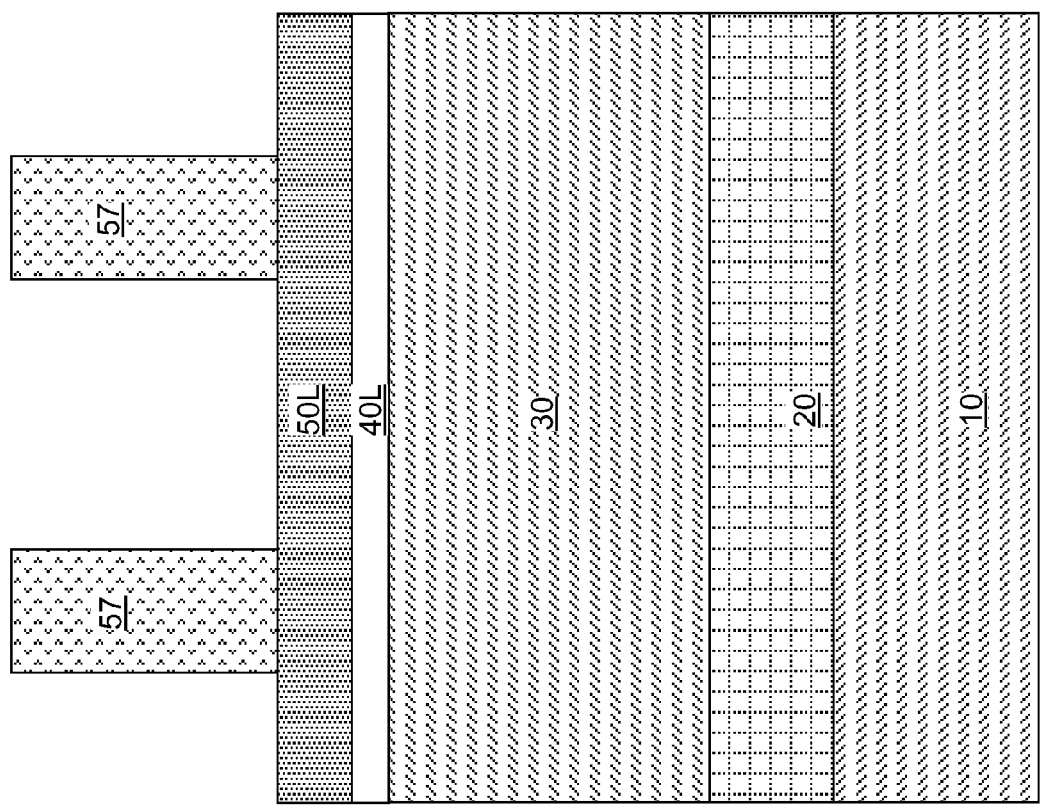
FIG. 2 is a vertical cross-sectional view of the first exemplary semiconductor structure after formation of an optional dielectric layer, an oxygen-impermeable layer, and a patterned etch mask layer according to an embodiment of the present disclosure.

Referring to FIG. 2, an optional dielectric layer 40L and an oxygen-impermeable layer 50L can be formed on the second epitaxial semiconductor layer 30. The optional dielectric layer 40L includes a dielectric material such as silicon oxide or a metal nitride. The oxygen-impermeable layer includes an oxygen-impermeable material such as silicon nitride. As used herein, an "oxygen-impermeable" material refers to a material through which oxygen does not diffuse at temperatures less than 1,000° C. during a 30 day period in a sufficient quantity to enable formation of a monolayer of an oxide material behind the material when provided at a thickness greater than 4 nm. The oxygen-impermeable material includes silicon nitride and metallic nitrides such as TiN, TaN, and WN.

The optional dielectric layer 40L can be formed, for example, by oxidation of a surface portion of the second epitaxial semiconductor layer 30, or by deposition of a dielectric material by chemical vapor deposition or other deposition methods. The thickness of the optional dielectric layer 40L, if present, can be from 1 nm to 50 nm, although lesser and greater thicknesses can also be employed.

The oxygen-impermeable layer 50L can be formed, for example, by chemical vapor deposition (CVD) or physical vapor deposition (PVD). In one embodiment, a silicon nitride layer can be deposited as the oxygen-impermeable layer 50L by chemical vapor deposition. The thickness of the oxygen-impermeable layer 50L can be from 5 nm to 100 nm, although lesser and greater thicknesses can also be employed.

A patterned etch mask layer 57 is formed over the oxygen-impermeable layer 50L. In one embodiment, the patterned etch mask layer 57 can be a patterned photoresist layer, which can be formed by applying and lithographically patterning a photoresist material over the oxygen-impermeable layer 50L.

The pattern in the patterned etch mask layer 57 can be selected such that the area of the patterned etch mask layer 57 is the same as the area of semiconductor fins to be subsequently formed. In one embodiment, each discrete portion of the patterned etch mask layer 57 can have a rectangular cross-sectional shape.

Figure 3A:
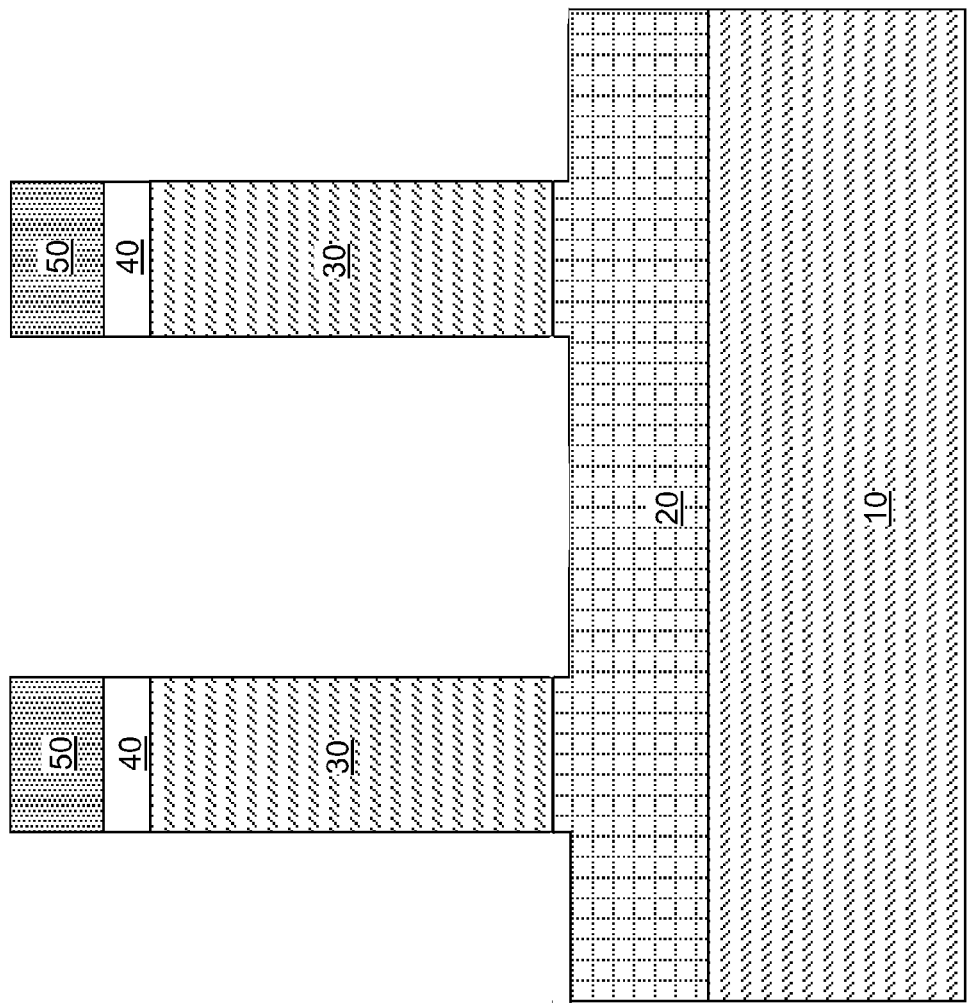
FIG. 3A is a vertical cross-sectional view of the first exemplary semiconductor structure after formation of vertical stacks of a semiconductor fin, an optional dielectric cap, and an oxygen-impermeable cap according to an embodiment of the present disclosure.
Figure 3B:
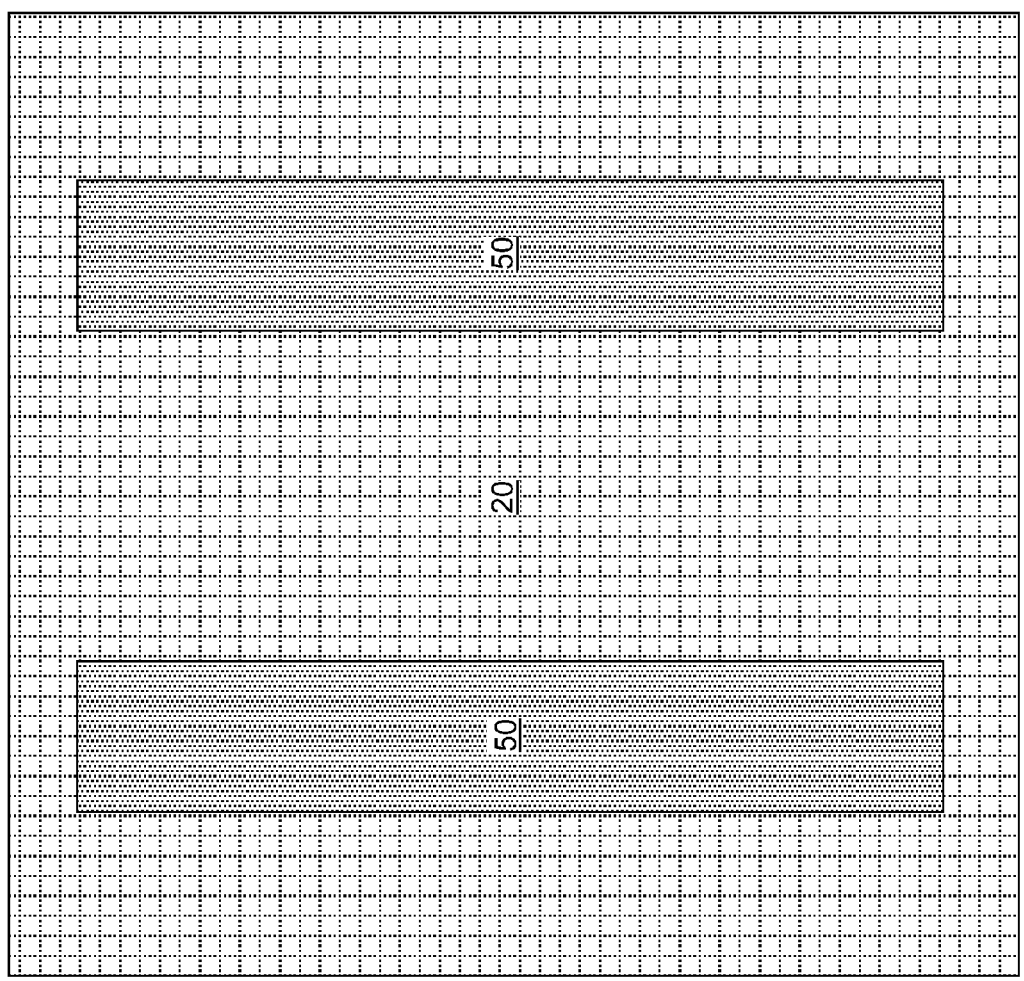
FIG. 3B is a top-down view of the first exemplary semiconductor structure of FIG. 3A.

Referring to FIGS. 3A and 3B, the oxygen-impermeable layer 50L and the optional dielectric layer 40L are patterned by a first anisotropic etch employing the patterned etch mask layer 57 as an etch mask. The patterned portions of the oxygen-impermeable layer 50L are herein referred to as oxygen-impermeable caps 50, and the patterned portions of the optional dielectric layer 40L are herein referred to as optional dielectric caps 40.

The pattern in the patterned etch mask layer 57 is transferred through the second epitaxial semiconductor layer 30 by a second anisotropic etch. The first epitaxial semiconductor layer 20 can be employed as an etch stop layer for the second anisotropic etch.

In one embodiment, the patterned etch mask layer 57 may be employed as an etch mask at least during an initial portion of the second anisotropic etch. The patterned etch mask layer 57 may be employed as the etch mask throughout the second anisotropic etch, or may be consumed during the second anisotropic etch and the oxygen-impermeable caps 50 may be employed as the etch mask during a latter portion of the second anisotropic etch. Any portion of the patterned etch mask layer 57 that is not consumed during the second anisotropic etch can be removed after the second anisotropic etch, for example, by ashing.

In another embodiment, the patterned etch mask layer 57 can be removed prior to the second anisotropic etch, for example, by ashing. The oxygen-impermeable caps 50 can be employed as an etch mask throughout the entirety of the second anisotropic etch.

Vertical stacks of a semiconductor fin 30, an optional dielectric cap 40, and an oxygen-impermeable cap 50 are formed over the first epitaxial semiconductor layer 20. In one embodiment, the physically exposed portions of the top surface of the first epitaxial semiconductor layer 20 may be vertically recessed relative to the interface between the top surface of the first epitaxial semiconductor layer 20 and the semiconductor fins 30 because a finite time passes between the detection of the end point of the second anisotropic etch (through detection of the physically exposed surfaces of the first epitaxial semiconductor layer 20) and termination of the second anisotropic etch. The semiconductor fins 30 include the second single crystalline semiconductor material, and are in epitaxial alignment with the first epitaxial semiconductor layer 20.

In one embodiment, the width of each vertical stack (30, 40, 50) as measured between a pair of parallel sidewalls can be from 4 nm to 50 nm, although lesser and greater widths can also be employed. In one embodiment, the spacing between vertical stacks (30, 40, 50) can be from 10 nm to 100 nm, although lesser and greater spacings can also be employed.

Figure 4:
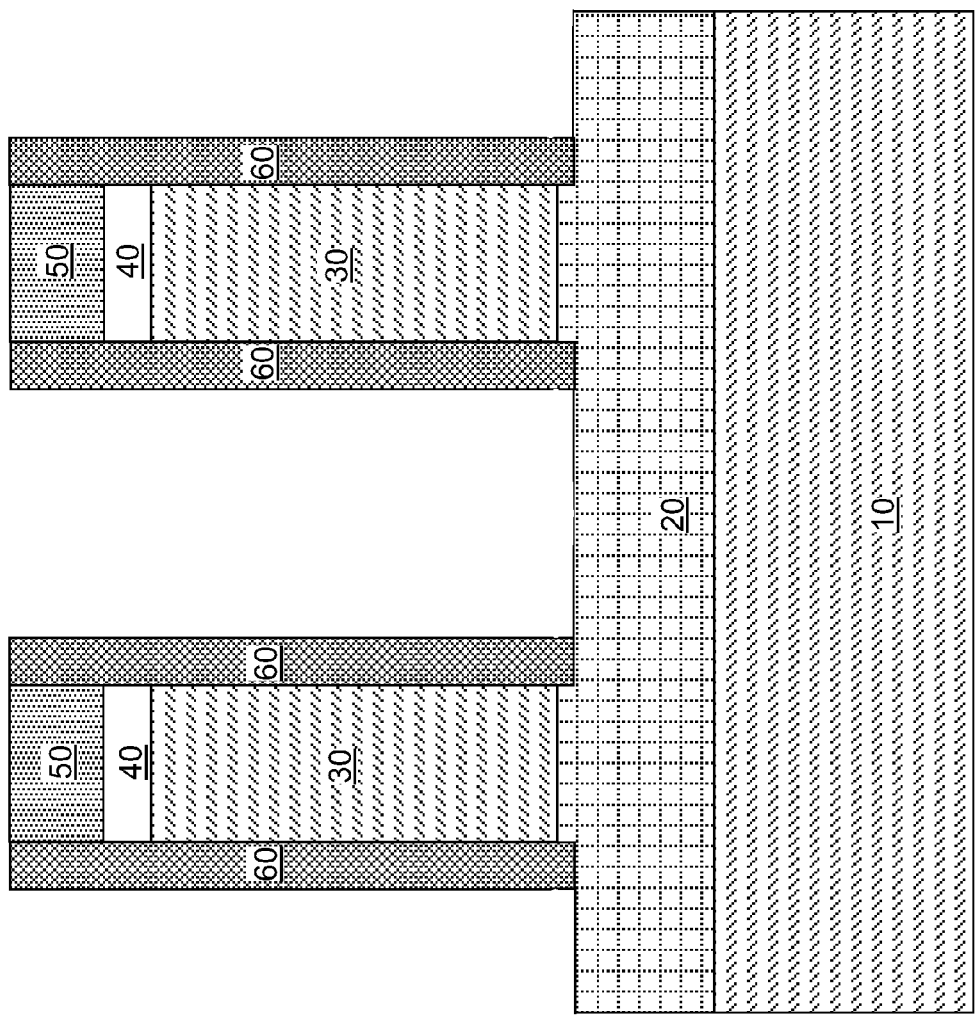
FIG. 4 is a vertical cross-sectional view of the first exemplary semiconductor structure after formation of oxygen-impermeable spacers according to an embodiment of the present disclosure.

Referring to FIG. 4, oxygen-impermeable spacers 60 are formed on sidewalls of each vertical stack of a semiconductor fin 30, an optional dielectric cap 40, and an oxygen-impermeable cap 50. The oxygen-impermeable spacers 60 include an oxygen-impermeable material such as silicon oxide or a metallic nitride (such as TiN, TaN, WN). In one embodiment, the oxygen-impermeable spacers 60 can include silicon nitride.

The oxygen-impermeable spacers 60 can be formed, for example, by deposition of a material layer and removal of horizontal portions of the material layer by an anisotropic etch. In one embodiment, the oxygen-impermeable spacers 60 can be formed by a conformal deposition of a silicon nitride layer by chemical vapor deposition (CVD) and by an anisotropic etch that removes the horizontal portions of the conformally deposited silicon nitride layer. The lateral thickness of each oxygen-impermeable spacer 60 (i.e., the lateral distance between an inner sidewall of an oxygen-impermeable spacer 60 and the most proximate outer sidewall of the oxygen-impermeable spacer 60) can be from 3 nm to 60 nm, although lesser and greater thicknesses can also be employed.

Figure 5:
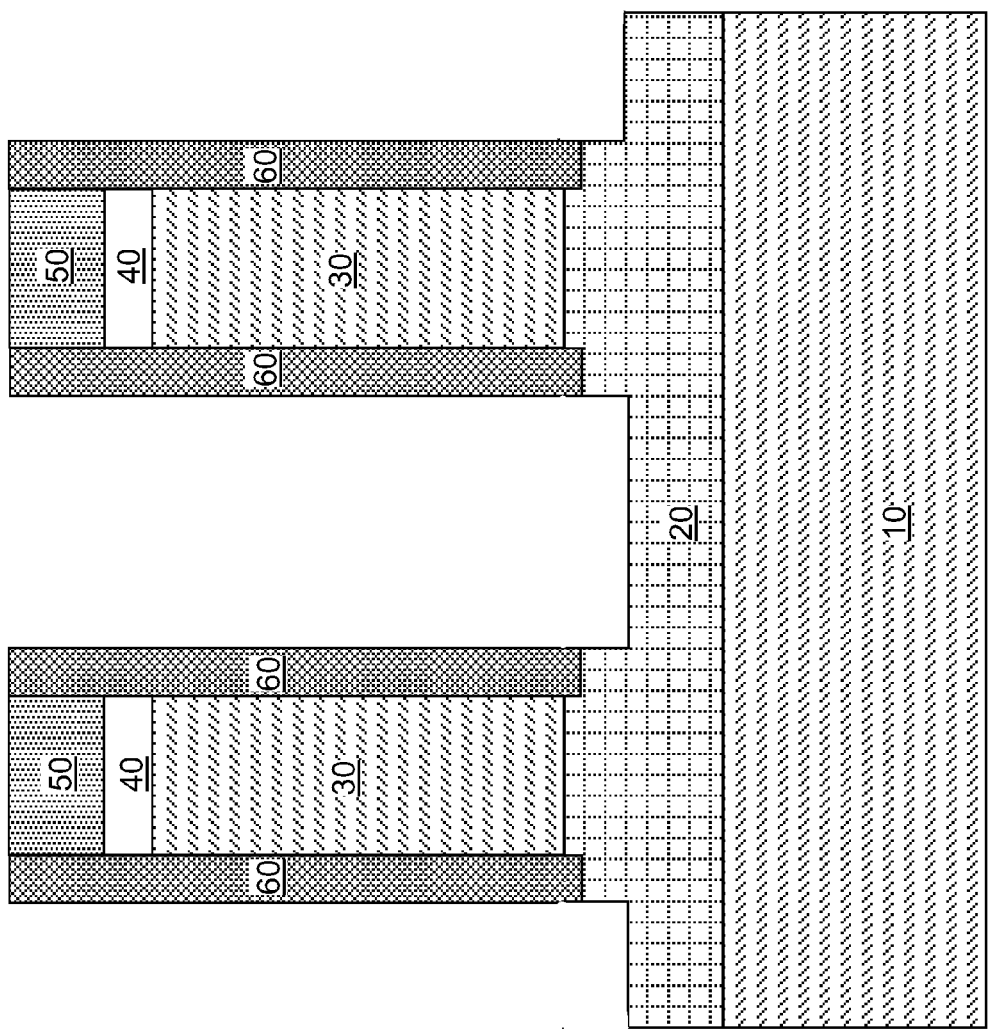
FIG. 5 is a vertical cross-sectional view of the first exemplary semiconductor structure after recessing physically exposed portions of the first epitaxial semiconductor layer according to an embodiment of the present disclosure.

Referring to FIG. 5, the physically exposed portions of the first epitaxial semiconductor layer 20 can be optionally recessed by another anisotropic etch relative to the bottom surfaces of the oxygen-impermeable spacers 60. The depth of recess does not exceed the thickness of the first epitaxial semiconductor layer 20 (as measured between the planar bottom surface of the first epitaxial semiconductor layer 20 and the interface with the semiconductor fins 30). In one embodiment, physically exposed surface portions of the first epitaxial semiconductor layer 20 may be structurally damaged by implantation of ions (such as germanium ions and/or ions of inert elements) so as to enhance the etch rate during the anisotropic etch that recesses physically exposed surfaces of the first epitaxial semiconductor layer 20.

Optionally, an isotropic etch may be performed to isotropically remove the material of the first epitaxial semiconductor layer 20 from underneath the oxygen-impermeable spacers 60. For example, a wet etch employing ammonia can be employed to laterally and vertically expand recessed regions in the first epitaxial semiconductor layer 20. The isotropic etch can reduce the level of oxidation-induced stress on remaining portions of the semiconductor fins 30 after an oxidation process to be subsequently performed.

Figure 6:
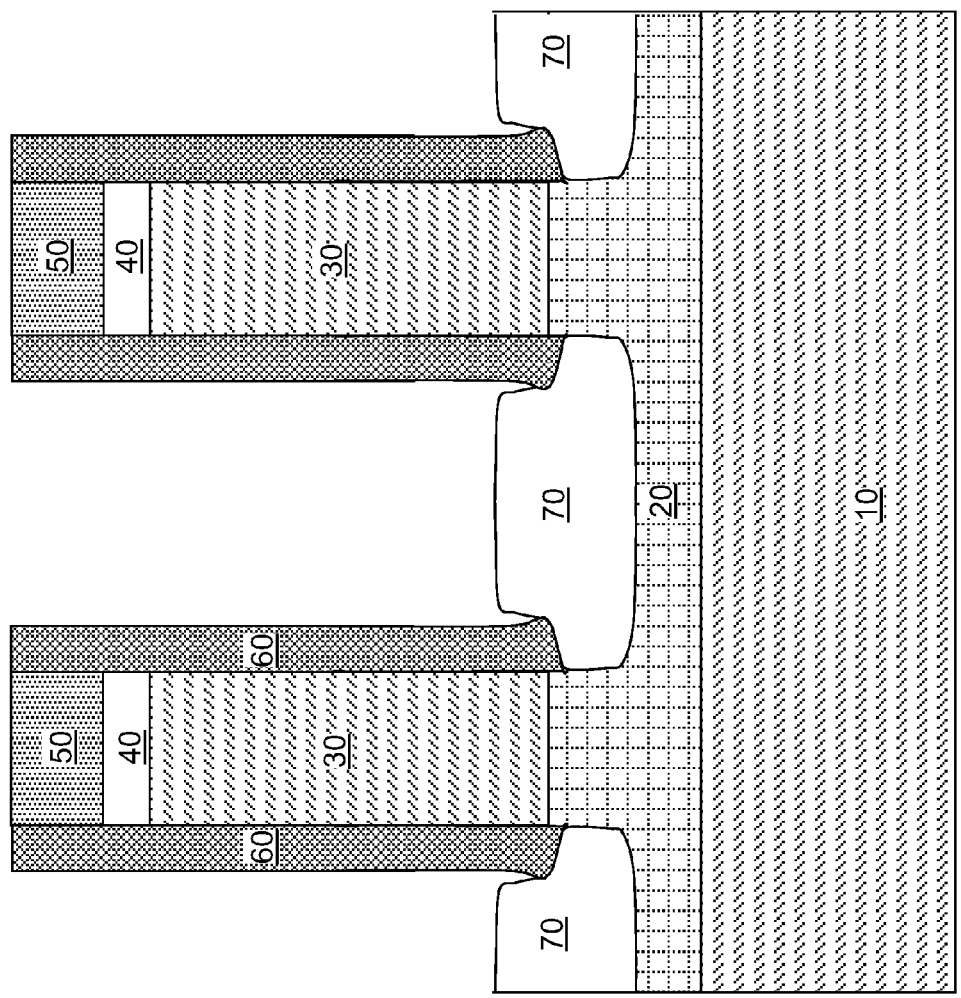
FIG. 6 is a vertical cross-sectional view of the first exemplary semiconductor structure during oxidation of portions of the first epitaxial semiconductor layer according to an embodiment of the present disclosure.

Referring to FIG. 6, portions of the first epitaxial semiconductor layer 20 are oxidized to form semiconductor oxide portions 70. The oxidation of the first epitaxial semiconductor layer 20 proceeds downward and outward from each surface portion of the first epitaxial semiconductor layer 20 that is physically exposed between the oxygen-impermeable spacers 60. As the oxidation of the first epitaxial semiconductor layer 20 proceeds, the first single crystalline semiconductor material is oxidized from underneath the oxygen-impermeable spacers 60 and then from underneath the semiconductor fins 30. During the oxidation, the oxygen-impermeable caps 50 and the oxygen-impermeable spacers 60 prevent diffusion of oxygen therethrough, and thereby prevent oxidation of the semiconductor fins 30 from the top surfaces or sidewall surfaces thereof.

Any thermal oxidation process known in the art may be employed to oxidize portions of the first epitaxial semiconductor layer 20. For example, wet oxidation or dry oxidation can be employed to oxidize portions of the first epitaxial semiconductor layer 20 and bottom portions of the semiconductor fins 30. Top portions of the single crystalline semiconductor substrate 10 may, or may not be oxidized.

Figure 7:
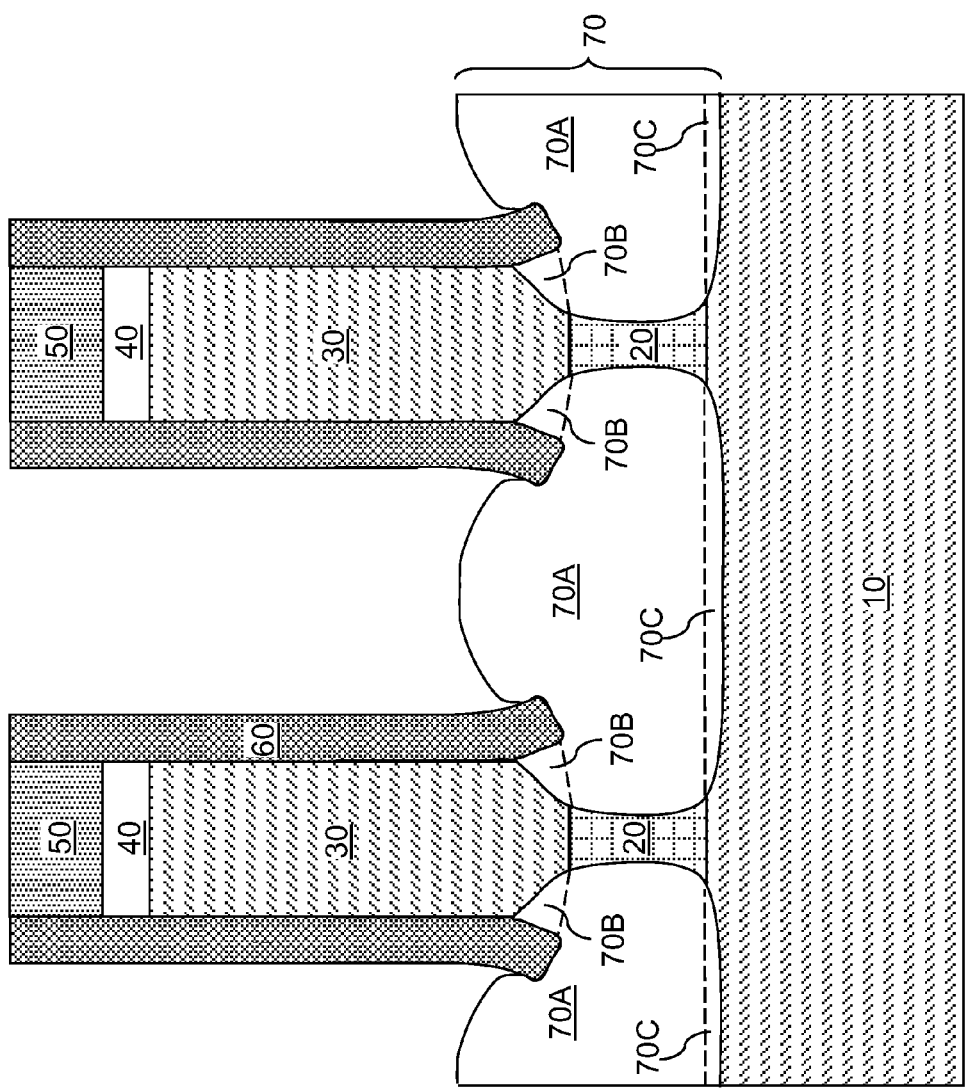
FIG. 7 is a vertical cross-sectional view of the first exemplary semiconductor structure after formation of semiconductor oxide portions by conversion of various portions of the first epitaxial semiconductor layer, bottom portions of the semiconductor fins, and optionally top portion of a substrate semiconductor layer according to an embodiment of the present disclosure.

Referring to FIG. 7, the temperature, the gas composition, the partial pressure of oxidizing agent(s), and the duration of the anneal can be selected such that the semiconductor oxide portions 70 are formed to underlie peripheral portions of each semiconductor fin 30. Each semiconductor oxide portion 70 can include a first semiconductor oxide portion 70A including an oxide of the first semiconductor material of the first epitaxial semiconductor layer 20, and a plurality of second semiconductor oxide portions 70B contacting the top surface of the first semiconductor oxide portion 70A and including an oxide of the second semiconductor material of the semiconductor fins 30, which can be different from the first semiconductor material. Each semiconductor oxide portion 70 may, or may not, include a third semiconductor oxide portion 70C located between the first semiconductor oxide portion 70A and the remaining portion of the single crystalline semiconductor substrate 10 and including an oxide of the third single crystalline semiconductor material, i.e., the semiconductor material of the single crystalline semiconductor substrate 10. If the semiconductor oxide portions 70 do not include any oxide of the third single crystalline material, the bottommost surface of the semiconductor oxide portions 70 can be vertically spaced from the topmost surface of the single crystalline semiconductor layer 10 by a portion of the first epitaxial semiconductor layer 20. If each semiconductor oxide portion 70 includes a third semiconductor oxide portion 70C, the third semiconductor oxide portion 70C is in contact with the remaining portion of the single crystalline semiconductor layer 10.

Each second semiconductor oxide portion 70B is formed by oxidizing a lower portion of a semiconductor fin 30. The oxidized lower portions of the semiconductor fin 30, i.e., the second semiconductor oxide portions 70B, are incorporated into the semiconductor oxide portions 70. Each remaining portion of the semiconductor fin 30 contacts an unoxidized semiconductor material portion of the first epitaxial semiconductor layer 20, which contacts the single crystalline semiconductor substrate 10.

In one embodiment, the first single crystalline semiconductor material of the first epitaxial semiconductor layer 20 can have a greater oxidation rate than the second single crystalline semiconductor material in the semiconductor fins 30. For example, the first single crystalline semiconductor material can include a silicon germanium alloy, and the second single crystalline semiconductor material can include silicon. In another example, the first single crystalline semiconductor material can include germanium or a silicon germanium alloy, and the second single crystalline semiconductor material can include another silicon germanium alloy having a greater atomic concentration of silicon than the first single crystalline semiconductor material.

In one embodiment, the single crystalline semiconductor substrate 10 is a single crystalline semiconductor material portion including a third single crystalline semiconductor material that is different from the first single crystalline semiconductor material. The semiconductor oxide portion 70 is located on single crystalline semiconductor substrate 10, which functions as a substrate semiconductor layer. The third semiconductor oxide portion 70C, if present, underlies, and contacts, the first semiconductor oxide portion 70A, and includes an oxide of the third single crystalline semiconductor material.

Figure 8:
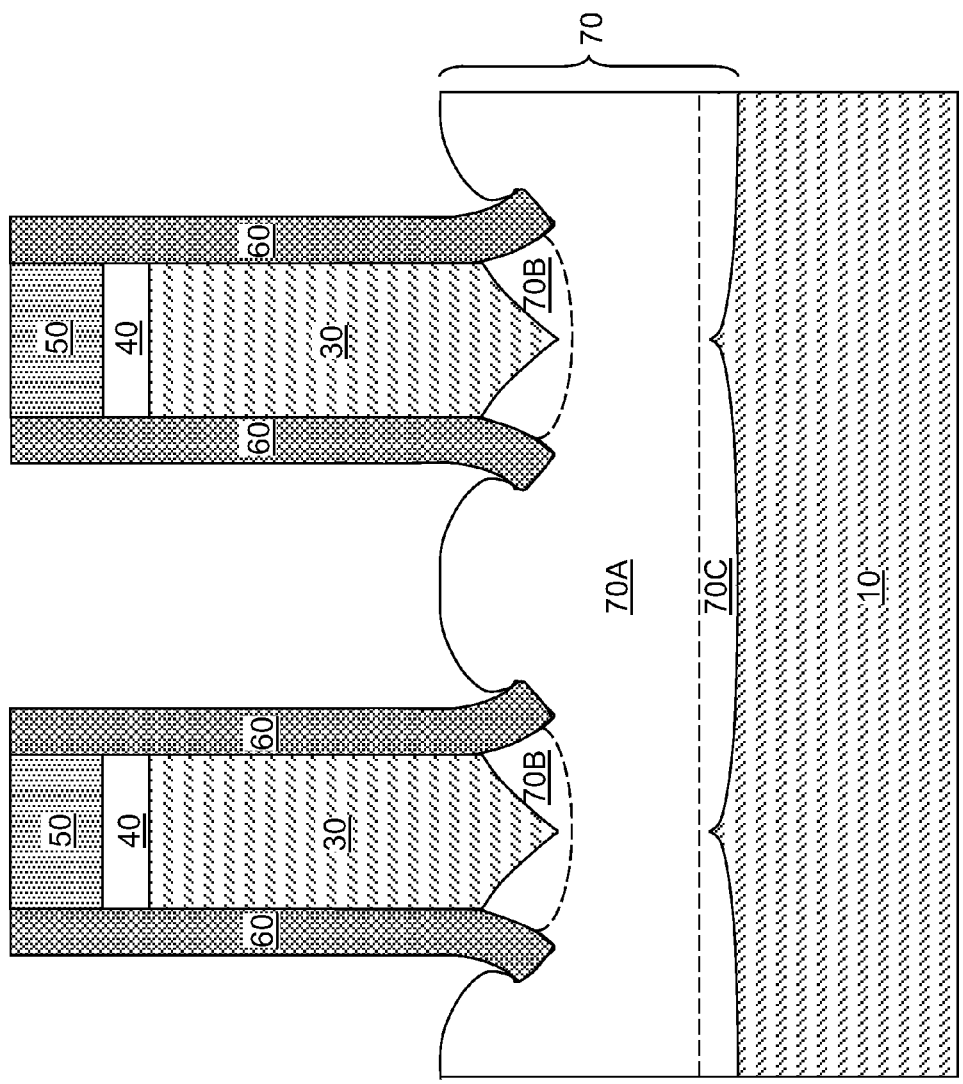
FIG. 8 is a vertical cross-sectional view of the first exemplary semiconductor structure after formation of a semiconductor oxide portion by conversion of the entirety of the first epitaxial semiconductor layer, bottom portions of the semiconductor fins, and a top portion of a substrate semiconductor layer according to the embodiment of the present disclosure.

Referring to FIG. 8, an alternate embodiment is illustrated, in which the temperature, the gas composition, the partial pressure of oxidizing agent(s), and the duration of the anneal are selected such that the semiconductor oxide portions 70 merge with one another to form a single semiconductor oxide portion 70 that contiguously extends across the entirety of the single crystalline semiconductor substrate 10.

In one embodiment, the semiconductor oxide portion 70 can be formed by conversion of the entirety of the first epitaxial semiconductor layer 20, bottom portions of the semiconductor fins 30, and an upper portion of the single crystalline semiconductor substrate 10, which is a substrate semiconductor layer. In this case, the semiconductor oxide portion 70 can include a first semiconductor oxide portion 70A including an oxide of the first semiconductor material of the first epitaxial semiconductor layer 20, a plurality of second semiconductor oxide portions 70B contacting the top surface of the first semiconductor oxide portion 70A and including an oxide of the second semiconductor material of the semiconductor fins 30, which can be different from the first semiconductor material, and a third semiconductor oxide portion 70C located between the first semiconductor oxide portion 70A and the remaining portion of the single crystalline semiconductor substrate 10 and including an oxide of the third single crystalline semiconductor material, i.e., the semiconductor material of the single crystalline semiconductor substrate 10.

Each second semiconductor oxide portion 70B is formed by oxidizing a lower portion of a semiconductor fin 30. The oxidized lower portions of the semiconductor fin 30, i.e., the second semiconductor oxide portions 70B, are incorporated into the semiconductor oxide portion 70. Each remaining portion of the semiconductor fin 30 is vertically spaced from an unoxidized semiconductor material portion of the single crystalline semiconductor substrate 10 by the semiconductor oxide portion 70.

In one embodiment, the first single crystalline semiconductor material of the first epitaxial semiconductor layer 20 can have a greater oxidation rate than the second single crystalline semiconductor material in the semiconductor fins 30. For example, the first single crystalline semiconductor material can include a silicon germanium alloy, and the second single crystalline semiconductor material can include silicon.

In another example, the first single crystalline semiconductor material can include germanium or a silicon germanium alloy, and the second single crystalline semiconductor material can include another silicon germanium alloy having a greater atomic concentration of silicon than the first single crystalline semiconductor material.

In one embodiment, an interface between the semiconductor oxide portion 70 and each semiconductor fin 30 can be a V-shaped groove, i.e., a groove having a vertical cross-sectional shape of a "V". The bottom portions of the oxygen-impermeable spacers 60 may be deformed during the oxidation process due to the stress applied thereupon as the various semiconductor materials become converted into semiconductor oxide portions.

In one embodiment, the single crystalline semiconductor substrate 10 is a single crystalline semiconductor material portion including a third single crystalline semiconductor material that is different from the first single crystalline semiconductor material. The semiconductor oxide portion 70 is located on single crystalline semiconductor substrate 10, which functions as a substrate semiconductor layer. The third semiconductor oxide portion 70C underlies, and contacts, the first semiconductor oxide portion 70A, and includes an oxide of the third single crystalline semiconductor material.

Figure 9:
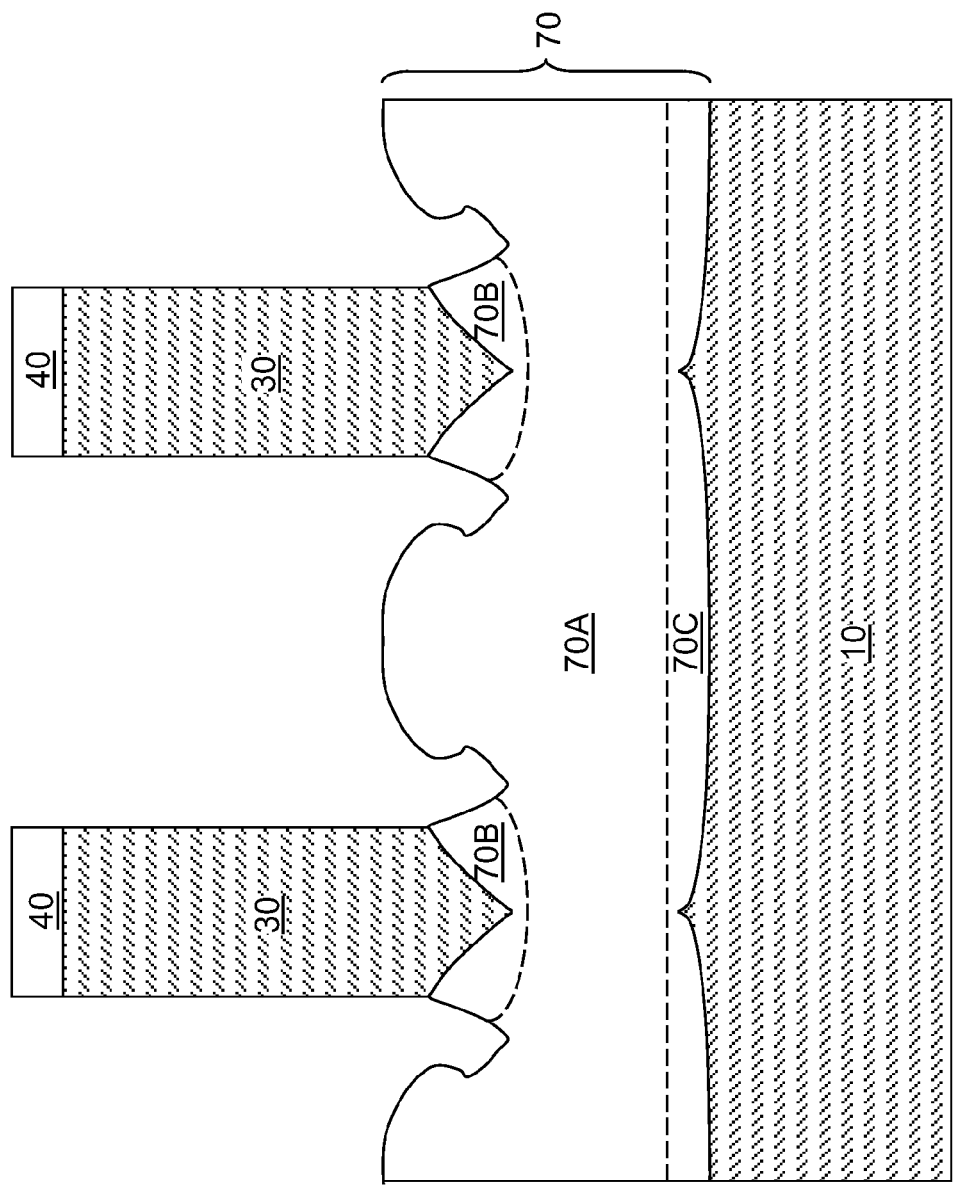
FIG. 9 is a vertical cross-sectional view of the first exemplary semiconductor structure after removal of the oxygen-impermeable caps and the oxygen-impermeable spacers according to an embodiment of the present disclosure.

Referring to FIG. 9, the oxygen-impermeable spacers 60 and oxygen-impermeable caps 50 in the first exemplary semiconductor structure of FIG. 7 or in the first exemplary semiconductor structure of FIG. 8 can be removed, for example, by an etch that is selective to the semiconductor material of the semiconductor fins 30. For example, if the oxygen-impermeable spacers 60 and oxygen-impermeable caps 50 include silicon nitride, a wet etch employing hot phosphoric acid can be employed to remove the oxygen-impermeable spacers 60 and oxygen-impermeable caps 50, while not etching the semiconductor fins 30 and the semiconductor oxide portion 70. While FIG. 9 illustrates an embodiment in which the first exemplary semiconductor structure of FIG. 8 is employed, embodiments in which the first exemplary semiconductor structure of FIG. 7 is employed are also contemplated herein.

Figure 10A:
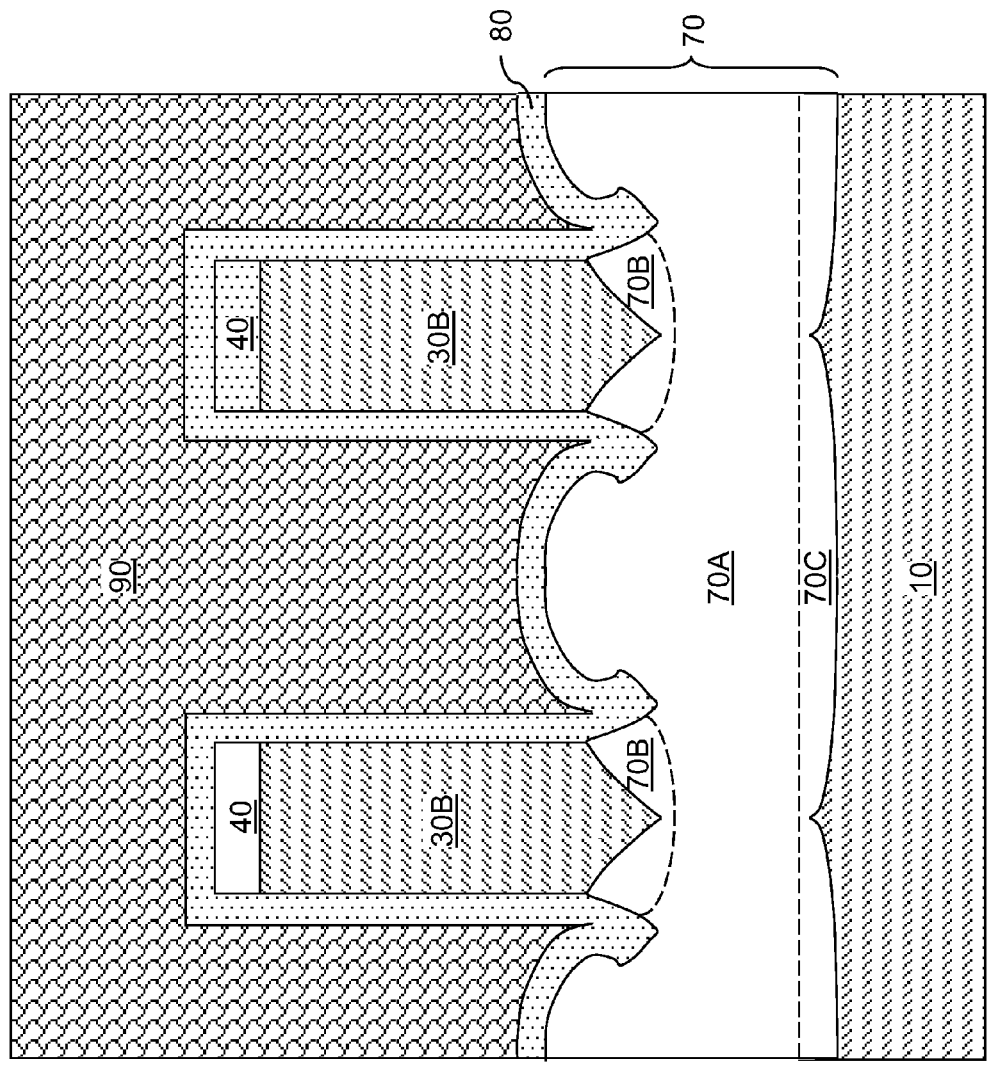
FIG. 10A is a vertical cross-sectional view of the first exemplary semiconductor structure after formation of a gate dielectric and a gate electrode according to an embodiment of the present disclosure.
Figure 10B:
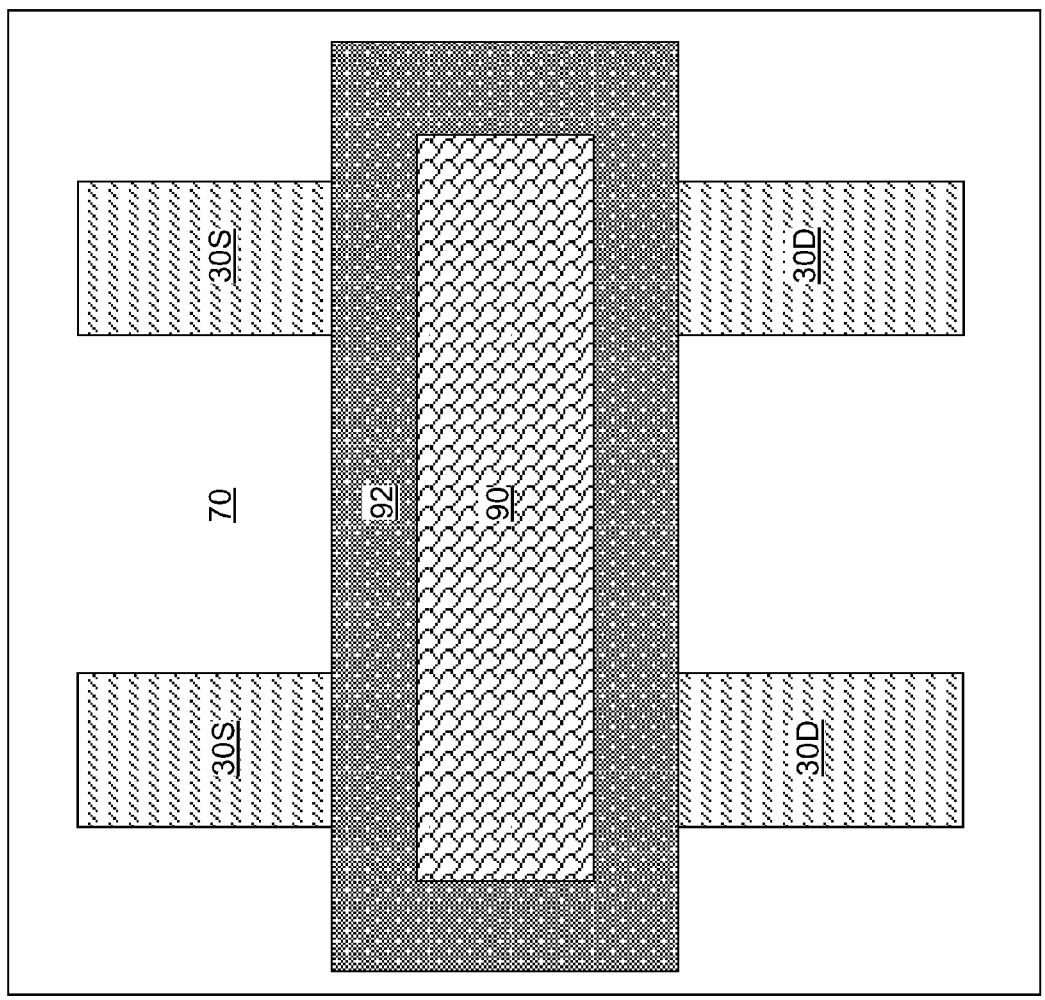
FIG. 10B is a top-down view of the first exemplary semiconductor structure of FIG. 10A.

Referring to FIGS. 10A and 10B, a gate dielectric 80 and a gate electrode 90 can be formed over center portions of the semiconductor fins 30. The gate dielectric 80 can include silicon oxide, silicon nitride, and/or silicon oxynitride. Alternately or additionally, the gate dielectric 80 can include at least one dielectric metal oxide such as $HfO_2$, $ZrO_2$, $LaO_2$, or combinations thereof. Any other gate dielectric material known in the art can also be employed for the gate dielectric 80. The gate electrode 90 can include at least one doped semiconductor material and/or at least one metallic material as known in the art. The gate dielectric 80 and the gate electrode 90 can be formed, for example, by depositing a stack of a gate dielectric layer and a conductive material layer, and patterning the stack of the gate dielectric layer and the conductive material layer by a combination of lithographic methods and at least one anisotropic etch.

Subsequently, at least one gate spacer 92 can be formed around the vertical stack of the gate dielectric 80 and the gate electrode 90. Electrical dopants (such as p-type dopants and/or n-type dopants) can be employed to form source regions 30S and drain regions 30D. Unimplanted regions of the semiconductor fins 30 constitute body regions 30B. The body regions 30B, the source regions 30S, the drain regions 30D, the gate dielectric 80, and the gate electrode 90 constitute a field effect transistor. While FIGS. 10A and 10B illustrate an embodiment in which the first exemplary semiconductor structure of FIG. 8 is employed, embodiments in which the first exemplary semiconductor structure of FIG. 7 is employed are also contemplated herein.

Figure 11:
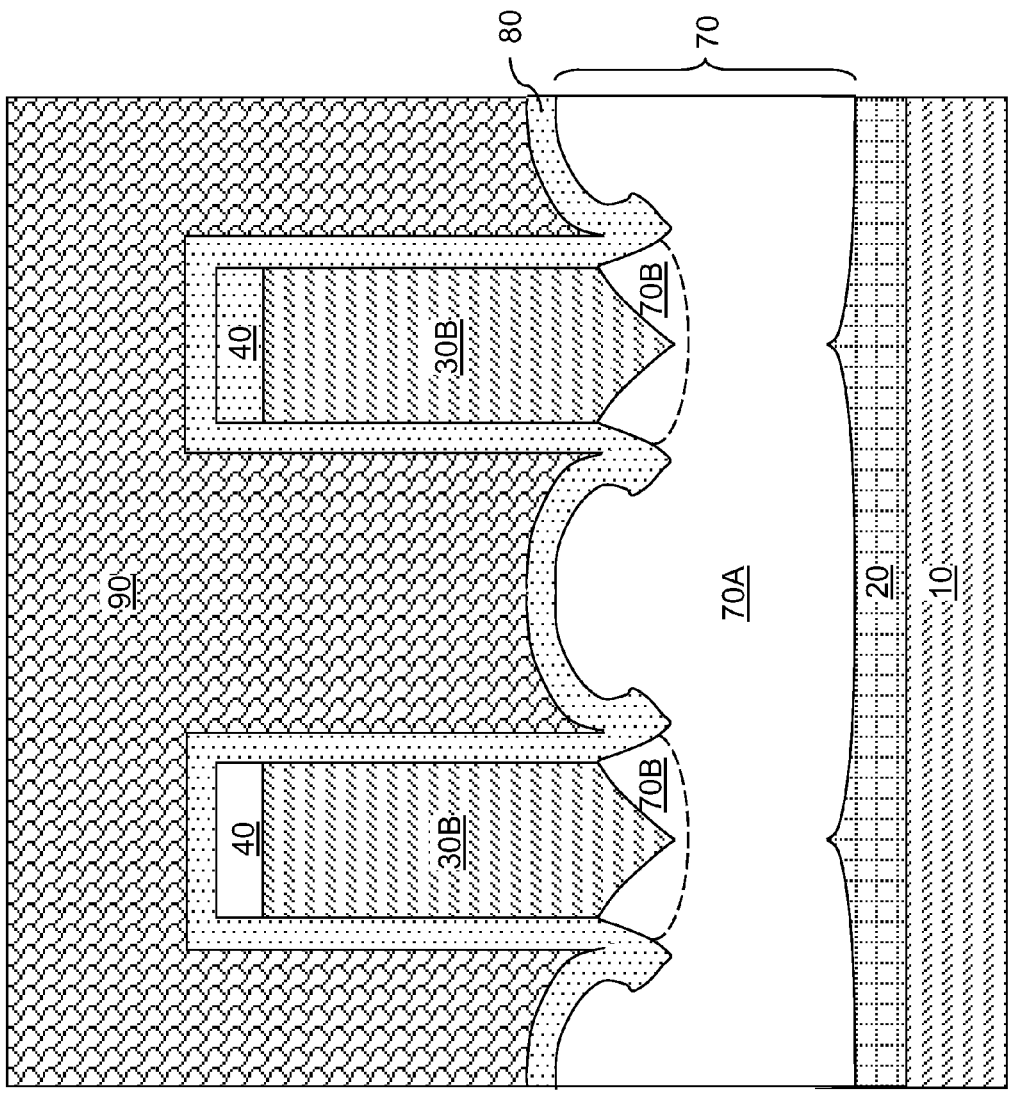
FIG. 11 is a vertical cross-sectional view of a variation of the first exemplary semiconductor structure according to an embodiment of the present disclosure.

Referring to FIG. 11, a variation of the first exemplary semiconductor structure can be derived from the first exemplary semiconductor structure of FIG. 6 by selecting the processing parameters of the oxidation process and/or the thickness of the first epitaxial semiconductor layer 20 such that a bottom portion of the first epitaxial semiconductor layer 20 is not oxidized during the oxidation process. In this case, the semiconductor oxide portion 70 can include a first semiconductor oxide portion 70A including an oxide of the first semiconductor material of the first epitaxial semiconductor layer 20 and a plurality of second semiconductor oxide portions 70B contacting the top surface of the first semiconductor oxide portion 70A and including an oxide of the second semiconductor material of the semiconductor fins 30, which can be different from the first semiconductor material.

Each second semiconductor oxide portion 70B is formed by oxidizing a lower portion of a semiconductor fin 30. The oxidized lower portions of the semiconductor fin 30, i.e., the second semiconductor oxide portions 70B, are incorporated into the semiconductor oxide portion 70. Each remaining portion of the semiconductor fin 30 is vertically spaced from an unoxidized semiconductor material portion of the first epitaxial semiconductor layer 20 by the semiconductor oxide portion 70.

The semiconductor oxide portion 70 is located directly on a single crystalline semiconductor material portion, which is the remaining portion of the first epitaxial semiconductor layer 20. The single crystalline semiconductor substrate 10 is a substrate semiconductor layer that includes the third single crystalline semiconductor material, which can be different from the first single crystalline semiconductor material. The single crystalline semiconductor substrate 10 is located underneath the single crystalline semiconductor material portion, i.e., the first epitaxial semiconductor layer 20.

A non-planar interface can be present between the semiconductor oxide portion 70 and the single crystalline semiconductor material portion, i.e., the first epitaxial semiconductor layer 20. The non-planar interface is vertically spaced from a planar interface between the first epitaxial semiconductor layer 20 and the single crystalline semiconductor substrate 10, i.e., the substrate semiconductor layer.

Figure 12:
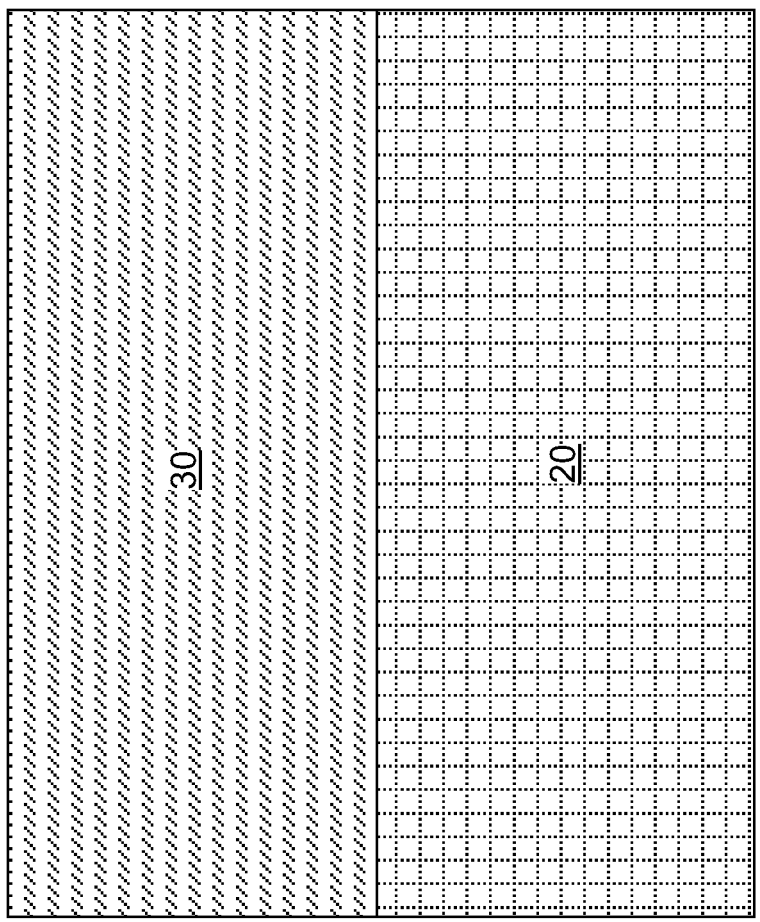
FIG. 12 is a vertical cross-sectional view of a second exemplary semiconductor structure after formation of a second epitaxial semiconductor layer on a first epitaxial semiconductor layer according to an embodiment of the present disclosure.

Referring to FIG. 12, a second exemplary semiconductor structure according to a second embodiment of the present disclosure includes a substrate of a first single crystalline semiconductor material. The substrate of the first single crystalline semiconductor material is herein referred to as a first epitaxial semiconductor layer 20, which can have the same composition and crystalline structure as in the first embodiment. A second epitaxial semiconductor layer 30 is formed on the first epitaxial semiconductor layer employing the same methods as in the first embodiment. The second epitaxial semiconductor layer 30 can be the same as in the first embodiment. In other words, the second exemplary semiconductor structure can be derived from the first exemplary semiconductor structure of FIG. 1 by substituting a substrate that includes the first epitaxial semiconductor layer 20 for the stack of the single crystalline semiconductor substrate 10 and the first epitaxial semiconductor layer 20 of the first embodiment.

Figure 13:
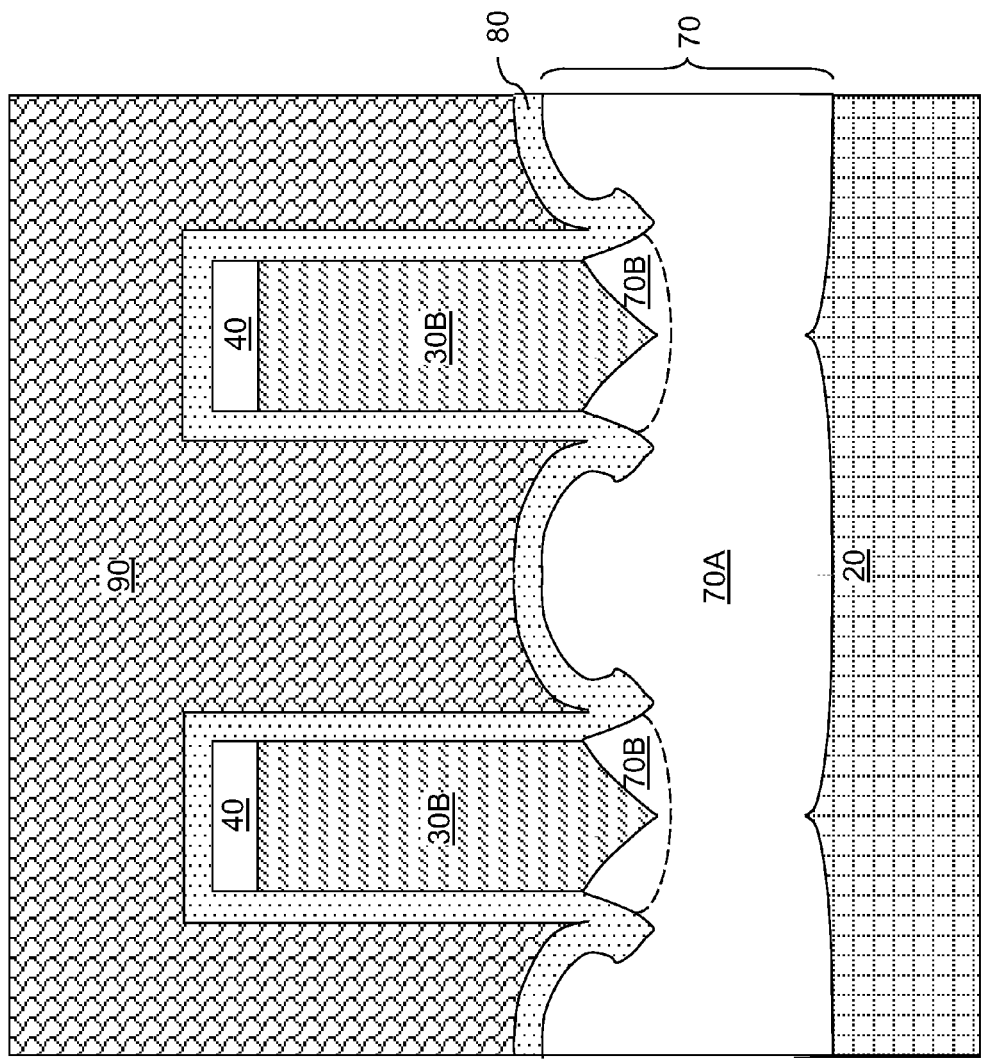
FIG. 13 is a vertical cross-sectional view of the second exemplary semiconductor structure after formation of a gate dielectric and a gate electrode according to an embodiment of the present disclosure.

The same processing steps can be performed as in the first embodiment to form the second exemplary semiconductor structure illustrated in FIG. 13. The semiconductor oxide portion 70 can include a first semiconductor oxide portion 70A including an oxide of the first semiconductor material of the first epitaxial semiconductor layer 20 and a plurality of second semiconductor oxide portions 70B contacting the top surface of the first semiconductor oxide portion 70A and including an oxide of the second semiconductor material of the semiconductor fins 30, which can be different from the first semiconductor material.

The methods and structures of the present disclosure can be employed to form semiconductor fins 30 having a well controlled height without using semiconductor-on-insulator substrates by use of end pointing of the second anisotropic etch. Additionally, by selecting the compositions for the first and second single crystalline semiconductor materials such that the first single crystalline semiconductor material has a greater oxidation rate than the second single crystalline semiconductor material, the oxidation of the bottom portions of the semiconductor fins 30 to form the second semiconductor oxide portions 70B can be well controlled and limited. Thus, the height of the semiconductor fins 30A can be uniform despite wafer-to-wafer and run-to-run non-uniformity. Therefore, the methods of the present disclosure provide an inexpensive method of forming semiconductor fins with uniform height.

While the disclosure has been described in terms of specific embodiments, it is evident in view of the foregoing description that numerous alternatives, modifications and variations will be apparent to those skilled in the art. Each of the embodiments described herein can be implemented individually or in combination with any other embodiment unless expressly stated otherwise or clearly incompatible. Accordingly, the disclosure is intended to encompass all such alternatives, modifications and variations which fall within the scope and spirit of the disclosure and the following claims.

What is claimed is:

1. A semiconductor structure comprising:
a single crystalline semiconductor material portion;
a semiconductor oxide portion located on said single crystalline semiconductor material portion and including a first semiconductor oxide portion comprising an oxide of a first semiconductor material and a second semiconductor oxide portion contacting a top surface of said first semiconductor oxide portion and comprising an oxide of a second semiconductor material that is different from said first semiconductor material; and
a semiconductor fin comprising said second semiconductor material,
wherein said second semiconductor oxide portion underlies at least a portion of said semiconductor fin such that a bottom surface of said semiconductor fin contacts a top surface of said second semiconductor oxide portion, and
wherein an entirety of a bottom surface of said second semiconductor oxide portion contacts said top surface of said first semiconductor oxide portion.

2. The semiconductor structure of claim 1, wherein an interface between said second semiconductor oxide portion and said semiconductor fin is a V-shaped groove.

3. The semiconductor structure of claim 1, wherein said first semiconductor material has a greater oxidation rate than said second semiconductor material.

4. The semiconductor structure of claim 3, wherein said first semiconductor material comprises a silicon germanium alloy, and said second semiconductor material comprises silicon.

5. The semiconductor structure of claim 3, wherein said first semiconductor material comprises germanium or a silicon germanium alloy, and said second semiconductor material comprises another silicon germanium alloy having a greater atomic concentration of silicon than said first semiconductor material.

6. The semiconductor structure of claim 1, wherein said single crystalline semiconductor material portion is a substrate semiconductor layer comprising a third single crystalline semiconductor material that is different from said first single crystalline semiconductor material.

7. The semiconductor structure of claim 6, wherein said semiconductor oxide portion comprises a third semiconductor oxide portion underlying said first semiconductor oxide portion and comprising an oxide of said third single crystalline semiconductor material.

8. The semiconductor structure of claim 1, wherein said single crystalline semiconductor material portion comprises said first semiconductor material.

9. The semiconductor structure of claim 8, further comprising a substrate semiconductor layer comprising a third semiconductor material that is different from said first semiconductor material and located underneath said single crystalline semiconductor material portion.

10. The semiconductor structure of claim 9, wherein a non-flat interface between said semiconductor oxide portion and said single crystalline semiconductor material portion is vertically spaced from a flat interface between said single crystalline semiconductor material portion and said substrate semiconductor layer.

11. The semiconductor structure of claim 1, wherein said semiconductor fin includes a pair of vertical sidewalls that are parallel to each other.

12. The semiconductor structure of claim 1, wherein said semiconductor fin is vertically spaced from said single crystalline semiconductor material portion by said semiconductor oxide portion.

13. The semiconductor structure of claim 1, wherein said second semiconductor oxide portion has a non-uniform thickness in a vertical direction.

14. The semiconductor structure of claim 1, wherein a topmost portion of said semiconductor oxide portion protrudes outside an area of said semiconductor fin above a horizontal plane including a bottommost portion of said semiconductor fin.

15. The semiconductor structure of claim 8, further comprising a non-flat interface between said semiconductor oxide portion and said single crystalline semiconductor material portion.

16. The semiconductor structure of claim 15, wherein a topmost portion of said single crystalline semiconductor material portion is located in a region within an area of said semiconductor fin.

17. The semiconductor structure of claim 1, wherein a top surface of said semiconductor oxide portion is recessed around an entire periphery of said semiconductor fin.

18. The semiconductor structure of claim 1, wherein said top surface of said first semiconductor oxide portion is a non-flat surface.

19. The semiconductor structure of claim 1, wherein said second semiconductor oxide portion laterally extends over a greater area than said semiconductor fin.

* * * * *